United States Patent [19]

Fishman et al.

[11] Patent Number: 5,010,757

[45] Date of Patent: Apr. 30, 1991

[54] METHOD OF FORMING DIMPLES IN A CONDUCTIVE SUBSTRATE

[75] Inventors: David A. Fishman, Santa Clara; Jon D. Hone, San Jose, both of Calif.

[73] Assignee: The United States of America as represented by the Secretary of the Air Force, Washington, D.C.

[21] Appl. No.: 471,308

[22] Filed: Jan. 29, 1990

[51] Int. Cl.⁵ .............................................. B21D 22/10
[52] U.S. Cl. ............................................ 72/60; 72/465
[58] Field of Search ..................... 72/60, 465; 29/423

[56] References Cited

U.S. PATENT DOCUMENTS

| | | | |
|---|---|---|---|
| 2,190,659 | 2/1940 | Guerin | 72/60 |
| 2,313,689 | 3/1943 | Waters | 72/60 |
| 2,841,083 | 7/1958 | Kirkpatrick et al. | 72/60 |
| 3,524,243 | 8/1970 | McKowen et al. | 29/423 |
| 3,678,577 | 7/1972 | Weglin et al. | 29/625 |
| 4,363,930 | 12/1982 | Hoffman | 174/68.5 |
| 4,552,004 | 11/1985 | Barfield et al. | 72/60 |
| 4,808,769 | 2/1989 | Nakano et al. | 174/68.5 |

Primary Examiner—Lowell A. Larson
Attorney, Agent, or Firm—Robert L. Nathans; Donald J. Singer

[57] ABSTRACT

Method of forming shallow fiducial dimples upon a thin flexible electrical circuit having a first deflectable substrate overlaying a second substrate have recesses therein to be aligned with the dimples, including providing a first support member having resilient cylindrical rubber pads affixed thereto, providing a second support member, positioning the flexible electrical circuit between the first and second support members so that the resilient pads are aligned with the recesses within the second substrate; and applying a sufficient opposing force to the first and second members to cause the first substrate to be deflected by the pads into the recesses to form the dimples.

12 Claims, 1 Drawing Sheet

METHOD OF FORMING DIMPLES IN A CONDUCTIVE SUBSTRATE

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of forming optical fiducials for guiding a numerically controlled tool.

A solar cell array flexible circuit was previously produced by providing recesses in an insulating substrate, and manually forming shallow 1 mil dimples in a 1 mil copper overlay sheet, which dimples were aligned with the recesses. The dimples were manually produced by rubbing the top surface of the copper sheet with cotton tipped applicator sticks to cause the copper sheet to be deflected into each recess to form each dimple. This tedious manual process was very time consuming.

The production of an array of such dimples each having a depth of about 1 mil, permitted the use of a numerically controlled welder, having a vision system, to correctly align the welding head over the recesses or access holes aligned with the dimples, to accurately weld the circuit to the solar cells.

SUMMARY OF THE INVENTION

In accordance with the present invention, the aforesaid tedious and time consuming manual method of forming the dimples is eliminated by applying resilient pads over the recesses while compressing the pads sufficiently to form the dimples within the copper overlay sheet. The method results not only in substantial savings in labor costs but produces more accurately formed dimples to increase the average "find" rate of the access holes by the vision system from about sixty percent to over ninety percent.

BRIEF DESCRIPTION OF THE DRAWINGS

Other objects, features, and advantages of the present invention will become apparent upon study of the following description taken in conjunction with the drawings in which.

DETAILED DESCRIPTION OF THE INVENTION

Figure 1:
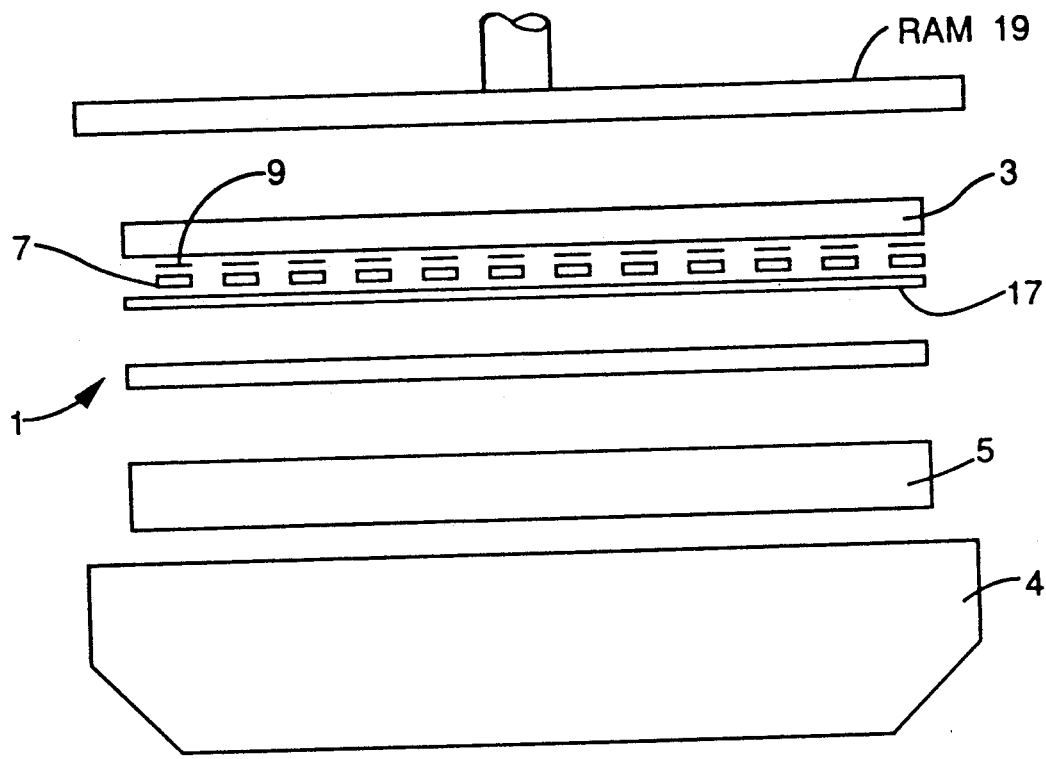
FIG. 1 illustrates a preferred embodiment of the invention.
Figure 2:
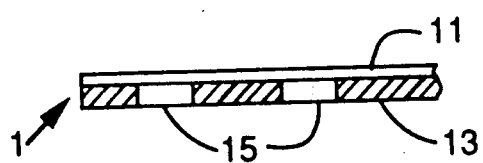
FIG. 2 illustrates a cross-section of a portion of the aforesaid flexible circuit.

Referring now to FIGS. 1 and 2, a flexible circuit 1, comprising a first deflectable substrate 11, overlaying a second substrate 13, shown in FIG. 2, is positioned between a first support member 3 and a second support member 5. Member 3 had a plurality of cylindrical silicone rubber pads 7 affixed thereto by an adhesive 9. Each pad had a diameter of three tenth of an inch and a thickness of 0.075 inches and was made of silicone rubber marketed by Dow Corning under the trade name "NPC-40". Adhesive 9 was a liquid pressure sensitive adhesive also made by Dow Corning and marked under the trade name "02-7406".

The first overlay substrate 11 of flexible circuit 1 is made of one mil thick copper which is resilient as mentioned above. This substrate is cleaned and dried to produce a bright, highly reflective surface. The second substrate 13 of the flexible circuit has the aforesaid recesses or access holes 15 formed therein which are aligned by the fixture of the invention with the cylindrical pads 7. These components are illustrated in an exploded format for clarity and are positioned between upper press ram 19 and lower press base 4. An additional sheet 17, of flexible "Teflon" plastic, having a thickness of one mil, is also positioned over flexible circuit 1 to prevent circuit contamination.

The press is now activated to compress cylindrical pads 7 by about fifty percent of their thickness to form the one mil deep dimples in the copper sheet 11 as previously discussed. The applied force is at least about ten pounds times the number of dimples formed simultaneously, where the dimples have a quarter inch diameter and where the thickness of the copper substrate is one mil. A rectangular array of dimples may be formed by providing a linear array of pads and producing rows of dimples by a step and repeat action. Alternatively, a two dimensional array of rubber pads 7 could be employed to simultaneously create a two dimensional dimple array which could also of course be step and repeated.

For a product having 1536 dimples, the process resulted in saving several hours of operator time to form the dimples using the aforesaid manual method, and the dimple find rate of the automated vision system was substantially increased.

While preferred embodiments of the present invention have been described, numerous variations will be apparent to the skilled worker in the art, and thus the scope of the invention is to be restricted only by the terms of the following claims and art recognized equivalents thereof.

What is claimed is:

1. Method of forming shallow fiducial dimples upon a thin flexible electrical circuit comprising a first deflectable substrate having a thickness of about one mil overlaying a second substrate having recesses therein to be aligned with said dimples, said method comprising the steps of:

(a) providing a first support member having highly resilient pads affixed thereto, said pads having a shape corresponding to the shape of said dimples;

(b) providing a second support member;

(c) positioning said flexible electrical circuit between said first and second support members so that said highly resilient pads are aligned with the recesses within said second substrate; and (d) applying a sufficient opposing force to said first and second members to cause said first substrate to be deflected by said pads by about one mil into said recesses to form said dimples.

2. The method of claim 1 wherein step (d) is performed by a mechanical press.

3. The method of claim 2 wherein said pads are compressed by about fifty percent of their thickness during the performance of step (d) upon the completion of the formation of said dimples.

4. The method of claim 3 wherein said force applied to said first and second support member is at least about ten pounds times the number of dimples formed simultaneously, where said dimples have a diameter of about 0.25 inches and where the thickness of said first deflectable substrate is about one mil.

5. Method of claim 4 further including placing a plastic sheet having a thickness of about one mil between said flexible electrical circuit and said resilient pads to prevent contamination of said flexible electrical circuit before the performance of step (d).

6. The method of claim 2 wherein said force applied to said first and second support member is at least about ten pounds times the number of dimples formed simultaneously, where said dimples have a diameter of about 0.25 inches and where the thickness of said first deflectable substrate is about one mil.

7. The method of claim 1 wherein said pads are compressed by about fifty percent of their thickness during the performance of step (d) upon the completion of the formation of said dimples.

8. The method of claim 7 wherein said force applied to said first and second support member is at least about ten pounds times the number of dimples formed simultaneously, where said dimples have a diameter of about 0.25 inches and where the thickness of said first deflectable substrate is about one mil.

9. Method of claim 7 further including placing a plastic sheet having a thickness of about one mil between said flexible electrical circuit and said resilient pads to prevent contamination of said flexible electrical circuit before the performance of step (d).

10. The method of claim 1 wherein said force applied to said first and second support member is at least about ten pounds times the number of dimples formed simultaneously, where said dimples have a diameter of about 0.25 inches and where the thickness of said first deflectable substrate is about one mil.

11. Method of claim 10 further including placing a plastic sheet having a thickness of about one mil between said flexible electrical circuit and said resilient pads to prevent contamination of said flexible electrical circuit before the performance of step (d).

12. Method of claim 1 further including placing a plastic sheet having a thickness of about one mil between said flexible electrical circuit and said resilient pads to prevent contamination of said flexible electrical circuit before the performance of step (d).

* * * * *